US011356065B2

(12) United States Patent
Gatard et al.

(10) Patent No.: US 11,356,065 B2
(45) Date of Patent: Jun. 7, 2022

(54) SYSTEM AND METHOD OF BASEBAND LINEARIZATION FOR A CLASS G RADIOFREQUENCY POWER AMPLIFIER

(71) Applicant: WUPATEC, Limoges (FR)

(72) Inventors: Emmanuel Gatard, Panazol (FR); Pierre Lachaud, Saint Just le Martel (FR)

(73) Assignee: WUPATEC, Limoges (FR)

( * ) Notice: Subject to any disclaimer, the term of this patent is extended or adjusted under 35 U.S.C. 154(b) by 0 days.

(21) Appl. No.: 17/050,220

(22) PCT Filed: Apr. 23, 2019

(86) PCT No.: PCT/IB2019/053335
§ 371 (c)(1),
(2) Date: Oct. 23, 2020

(87) PCT Pub. No.: WO2019/207476
PCT Pub. Date: Oct. 31, 2019

(65) Prior Publication Data
US 2021/0234515 A1    Jul. 29, 2021

(30) Foreign Application Priority Data
Apr. 25, 2018    (FR) .................................. 18/53628

(51) Int. Cl.
*H03F 1/26*    (2006.01)
*H03F 1/32*    (2006.01)
(Continued)

(52) U.S. Cl.
CPC ......... *H03F 1/3258* (2013.01); *H03F 1/3294* (2013.01); *H03F 3/189* (2013.01);
(Continued)

(58) Field of Classification Search
CPC ...... H03F 1/3258; H03F 1/3294; H03F 3/189; H03F 3/24; H03F 2200/451;
(Continued)

(56) References Cited

U.S. PATENT DOCUMENTS 3,772,606 A    11/1973   Waehner
6,236,837 B1*  5/2001   Midya .................. H03F 1/3258
                                                              455/63.1
(Continued)

FOREIGN PATENT DOCUMENTS

EP    1 590 893    11/2005
EP    1 645 094    4/2006
(Continued)

OTHER PUBLICATIONS

A. Brackle, et al., "Power Supply Modulation for RF Applications", 15th International Power Electronics and Motion Control Conference, EPE-PEMC 2012 ECCE Europe, IEEE, 2012, 5 pages.
(Continued)

*Primary Examiner* — Khanh V Nguyen
(74) *Attorney, Agent, or Firm* — Nixon & Vanderhye

(57) ABSTRACT

Disclosed is a system and a method of baseband linearization for a class G radiofrequency power amplifier, the linearization system including a module for selecting the amplifier power supply voltage, a digital predistortion module, and a module for extracting predistortion coefficients, wherein the linearization system also includes a digital filter with complex coefficients, the input of which is connected to the output of the digital predistortion module, and a module for extracting filter coefficients which is designed to extract filter coefficients used by the digital filter with complex coefficients.

20 Claims, 6 Drawing Sheets

(51) Int. Cl.
*H03F 3/189* (2006.01)
*H03F 3/24* (2006.01)

(52) U.S. Cl.
CPC ......... *H03F 3/24* (2013.01); *H03F 2200/451* (2013.01); *H03F 2201/3224* (2013.01); *H03F 2201/3233* (2013.01)

(58) Field of Classification Search
CPC ..... H03F 2201/3224; H03F 2201/3233; H03F 1/025; H03F 1/3247; H03F 1/3241; H03F 1/3229; H03F 1/26; H03F 1/0244; H03F 1/0211; H03F 2200/504; H03F 3/04
USPC .................. 330/136, 149, 297; 375/296, 297
See application file for complete search history.

(56) References Cited

U.S. PATENT DOCUMENTS

| | | | |
|---|---|---|---|
| 7,259,630 B2 * | 8/2007 | Bachman, II | H03F 1/0211 327/355 |
| 7,289,773 B2 | 10/2007 | Braithwaite | |
| 7,742,748 B2 | 6/2010 | Matero et al. | |
| 8,159,295 B2 | 4/2012 | Asbeck et al. | |
| 8,649,746 B2 * | 2/2014 | Kang | H04B 1/0475 455/114.3 |
| 8,811,917 B2 * | 8/2014 | Kim | H03F 1/3258 455/114.3 |
| 8,824,978 B2 | 9/2014 | Briffa et al. | |
| 8,829,993 B2 | 9/2014 | Briffa et al. | |
| 9,088,472 B1 | 7/2015 | Jain et al. | |
| 10,116,341 B1 * | 10/2018 | Menkhoff | H03F 1/02 |
| 2001/0001546 A1 | 5/2001 | Ahuja et al. | |
| 2004/0179629 A1 | 9/2004 | Song et al. | |
| 2008/0140902 A1 | 6/2008 | Townsend | |
| 2010/0073088 A1 | 3/2010 | Wimpenny et al. | |
| 2010/0277236 A1 | 11/2010 | Horiguchi et al. | |
| 2010/0295613 A1 | 11/2010 | Asbeck et al. | |
| 2014/0118065 A1 | 5/2014 | Briffa et al. | |
| 2014/0132354 A1 | 5/2014 | Briffa et al. | |
| 2014/0362949 A1 | 12/2014 | Pratt | |
| 2015/0180519 A1 | 6/2015 | Kim et al. | |

FOREIGN PATENT DOCUMENTS

| | | |
|---|---|---|
| EP | 1 851 927 | 11/2007 |
| EP | 1 983 659 | 10/2008 |
| EP | 2 130 296 | 12/2009 |
| EP | 2 202 878 | 6/2010 |
| EP | 2 244 380 | 10/2010 |
| EP | 2 290 811 | 3/2011 |
| EP | 2 521 260 | 11/2012 |
| EP | 2 521 261 | 11/2012 |
| EP | 2 759 056 | 7/2014 |
| EP | 2 820 762 | 1/2015 |
| EP | 2 903 156 | 8/2015 |
| EP | 2 915 251 | 9/2015 |
| EP | 3 041 132 | 7/2016 |
| WO | 00/69065 | 11/2000 |
| WO | 2004/065996 | 8/2004 |
| WO | 2005/008883 | 1/2005 |
| WO | 2006/091130 | 8/2006 |
| WO | 2008/106364 | 9/2008 |
| WO | 2013/044238 | 3/2013 |
| WO | 2013/128300 | 9/2013 |
| WO | 2014/070475 | 5/2014 |
| WO | 2014/197484 | 12/2014 |

OTHER PUBLICATIONS

Corrado Florian, et al., "Envelope Tracking of an RF High Power Amplifier With an 8-Level Digitally Controlled GaN-on-Si Supply Modulator", IEEE Transactions on Microwave Theory and Techniques, vol. 63, No. 8, Aug. 2015, pp. 2589-2602.
Pere L. Gilabert, et al., "Look-Up Table Implementation of a Slow Envelope Dependent Digital Predistorter for Envelope Tracking Power Amplifiers", IEEE Microwave and Wireless Components Letters, vol. 22, No. 2, Feb. 2012, pp. 97-99.
Shigeru Hiura, et al., "High-Efficiency 400 W Power Amplifier with Dynamic Drain Voltage Control for 6 MHz OFDM Signal", IEEE, 2010, pp. 936-939.
Jinseong Jeong, et al., "Wideband Envelope Tracking Power Amplifiers With Reduced Bandwith Power Supply Waveforms and Adaptive Digital Predistortion Techniques", IEEE Transactions on Microwave Theory and Techniques, vol. 57, No. 12, Dec. 2009, pp. 3307-3314.
Frederick H. Raab, "Average Efficiency of Class-G Power Amplifiers", IEEE Transactions on Consumer Electronics, vol. CE-32, No. 2, May 1986, pp. 145-150.
Nikolai Wolff, et al., "A Novel Model for Digital Predistortion of Discrete Level Supply-Modulated RF Power Amplifiers", IEEE Microwave and Wireless Components Letter, vol. 26, No. 2, Feb. 2016, pp. 146-148.
Search Report and Written Opinion of the ISA for FR Application No. 1853628 dated Jan. 31, 2019, 13 pages.
International Search Report for PCT/IB2019/053335 dated Jun. 14, 2019, 4 pages.
Written Opinion of the ISA for PCT/IB2019/053335 dated Jun. 14, 2019, 10 pages.

* cited by examiner

[Fig. 1]
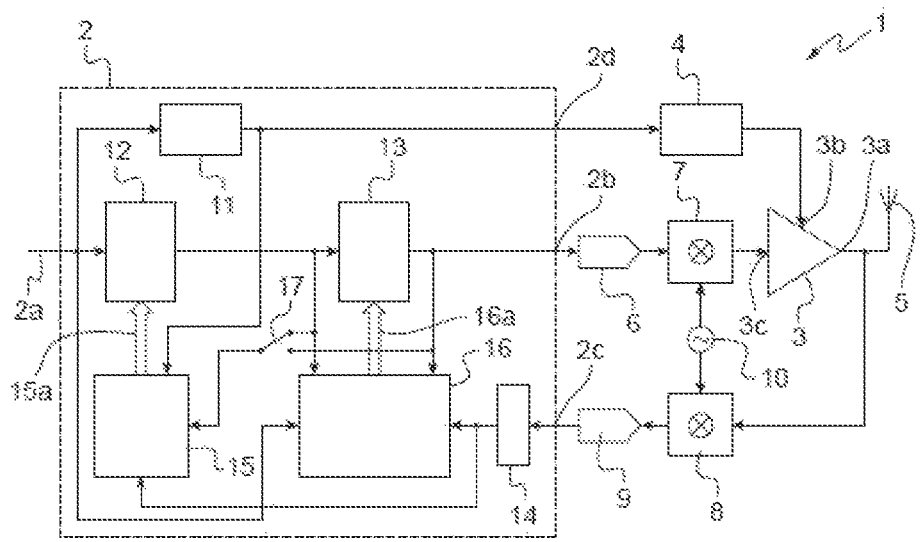
[Fig. 2]
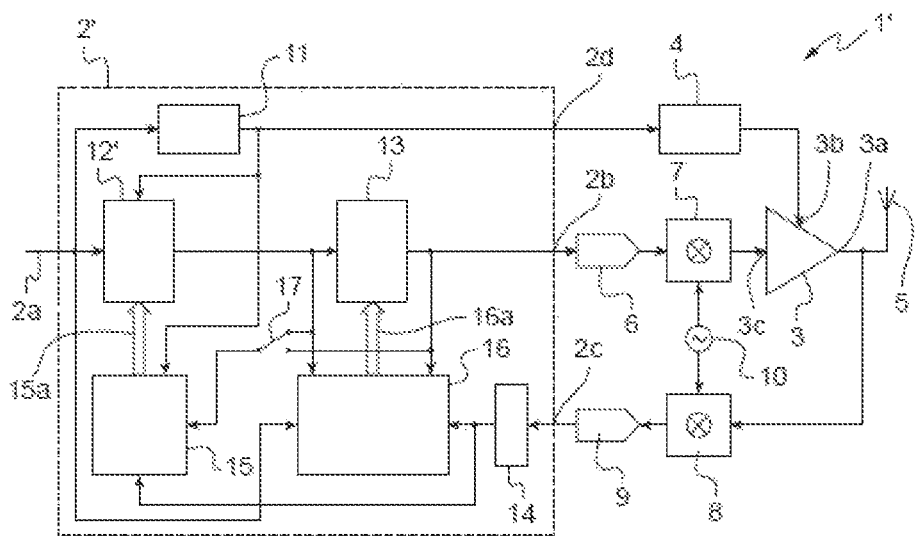

[Fig. 3]
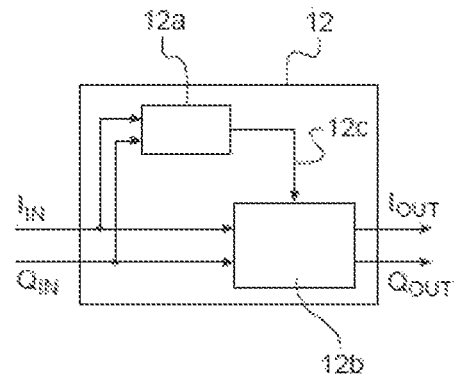
[Fig. 4]
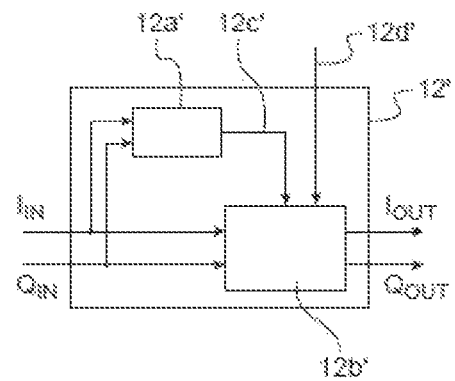
[Fig. 5]
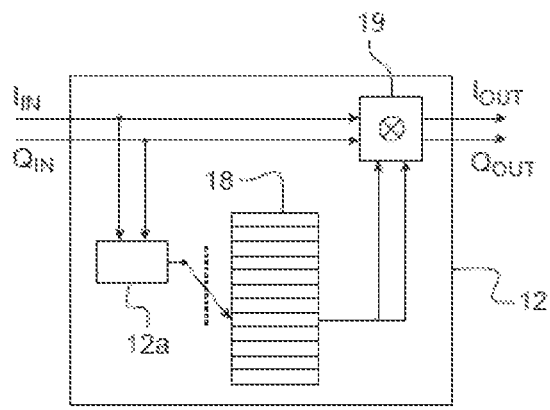

[Fig. 6]
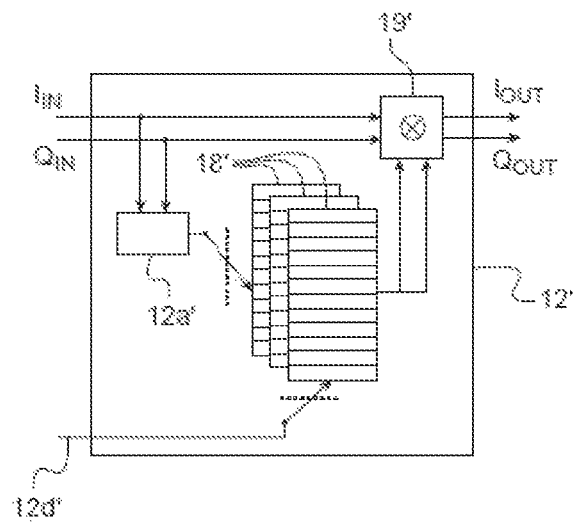
[Fig. 7]
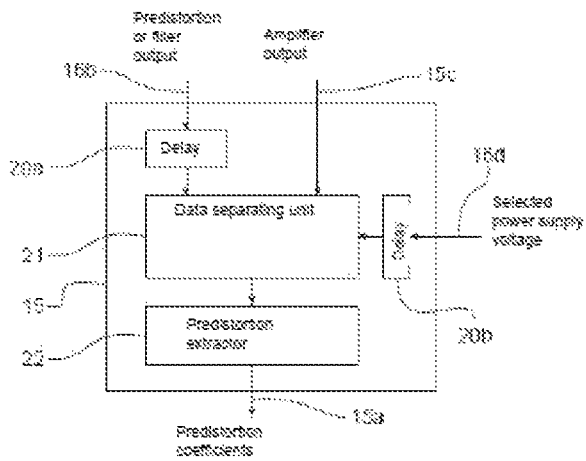

[Fig. 8]
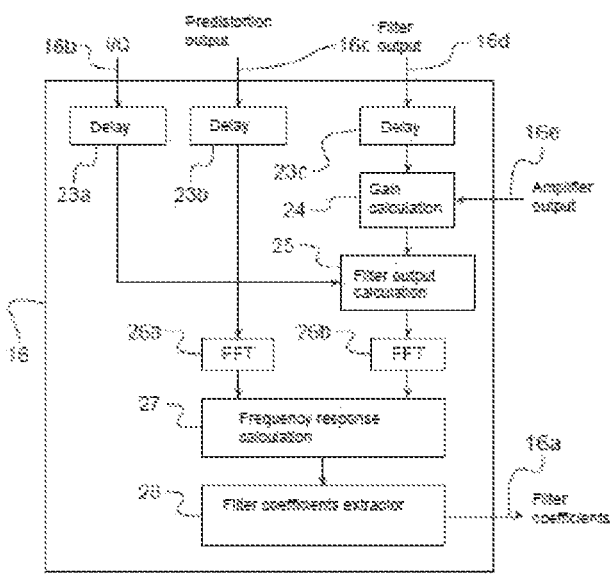
[Fig. 9]
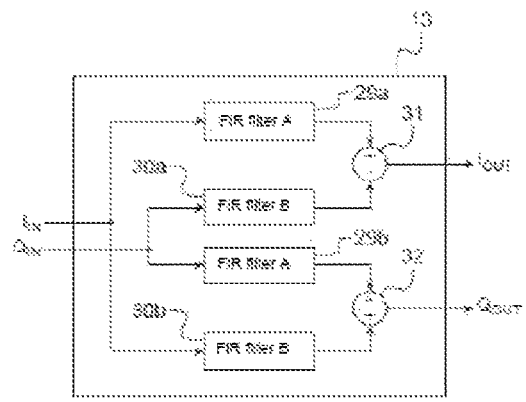

[Fig. 10]
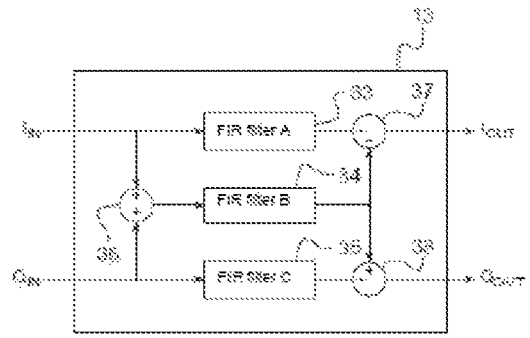
[Fig. 11]
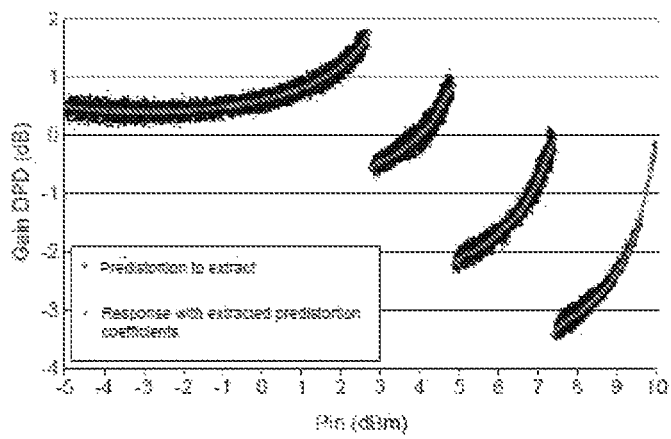
[Fig. 12]
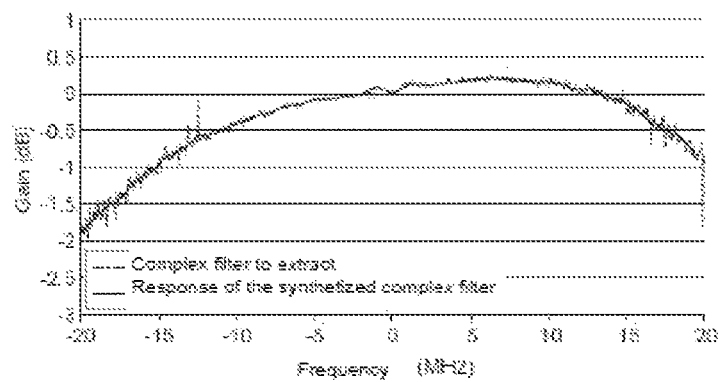

[Fig. 13]
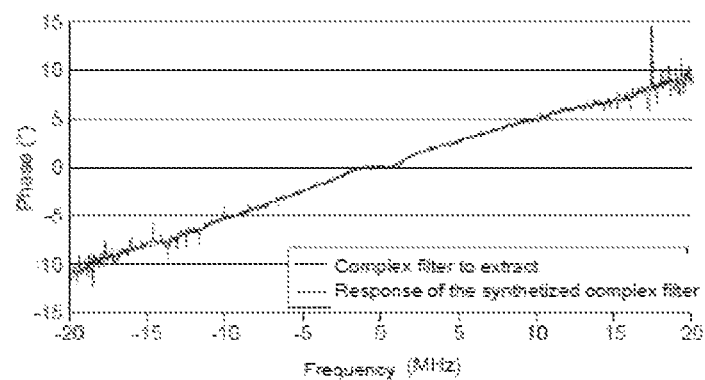
[Fig. 14]
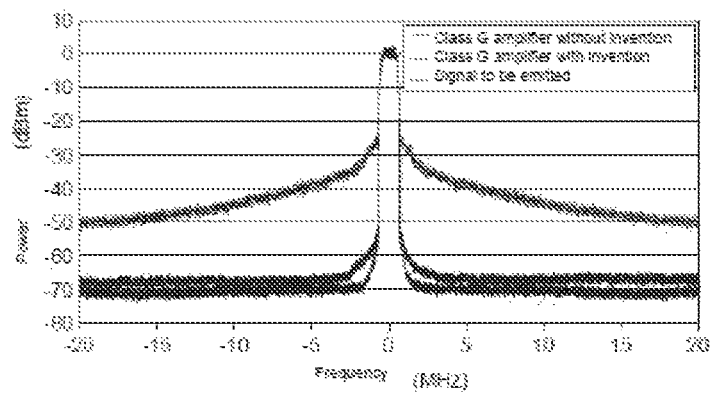

SYSTEM AND METHOD OF BASEBAND LINEARIZATION FOR A CLASS G RADIOFREQUENCY POWER AMPLIFIER

This application is the U.S. national phase of International Application No. PCT/IB2019/053335 filed Apr. 23, 2019 which designated the U.S. and claims priority to FR Patent Application Ser. No. 18/53,628 filed Apr. 25, 2018, the entire contents of each of which are hereby incorporated by reference.

The present invention relates to the field of wireless telecommunications systems, and in particular relates to a system and method of baseband linearization for a class G radiofrequency power amplifier.

Within wireless telecommunications systems, the power amplifier appears to be a critical element for the development of new applications, such as those considered for the fifth generation (5G) or for the Internet of things (IoT).

Today, power amplifiers must be capable of auto-adapting to the types of signals to be emitted so as to optimize their energy consumption, but also of satisfying high linearity requirements with respect to increasingly complex modulations.

The new wireless communication standards require the use of complex modulations with high spectral responsivity, such as OFDM (orthogonal frequency-division multiplexing), with the aim of optimizing the capabilities of the deployed links.

These modulations have high crest factors (that is to say large ratios between the peak power and the average power of the signal) and large modulation bandwidths.

In this context, the conventional radiofrequency (RF) or microwave power amplifiers that are powered by a direct current supply voltage provide a relatively low efficiency, the power amplifier most often operating under conditions where its efficiency is much lower than its maximum efficiency.

The envelope tracking technique is a supply technique making it possible to improve the efficiency of radiofrequency power amplifiers. It replaces the direct current supply of the power amplifier by a dynamic supply, the level of which depends on the power to be emitted. This technique has many advantages relative to other efficiency optimizing techniques used in particular in base stations for mobile telephony.

The envelope tracking technique makes it possible to adjust the power supply voltage of the radiofrequency power amplifier dynamically so that the latter still works at its maximum efficiency irrespective of the power level of the signal to be emitted.

In the case of a power amplifier using the envelope tracking technique, the power supply voltage is, by definition, constantly readjusted so as to ensure that the power amplifier is always working in compression and therefore at its maximum efficiency irrespective of the desired emission power.

One particular technique related to the envelope tracking technique is based on the use of a supply signal of the power amplifier of the multilevel type (or with multiple discrete supply levels). The operation of the radiofrequency power amplifier is then that of a class G power amplifier.

Class G amplification is easy to implement, but does not make it possible to improve the efficiency of the power amplifier as much as the continuous envelope tracking technique.

The generation of a supply control signal with multiple discrete levels is ensured by the selection of a power supply voltage from among several supply sources arranged in parallel or in series. This particular amplification technique has the advantage of supporting very large modulation bandwidths while maintaining a high efficiency of the supply modulator providing the power supply voltage to the power amplifier.

For a supply signal using several discrete supply levels, each applied power supply voltage is defined for an input power range of the power amplifier. The span of each range primarily depends on the number of discrete levels available and characteristics of the power amplifier. The supply voltages are not necessarily evenly distributed between the minimum voltage and the maximum voltage supplied to the radiofrequency power amplifier.

In radiofrequency or microwave, the significant variations of the electrical characteristics of the power amplifier as a function of the power, the frequency or the power supply voltage lead to distortions of the signal to be emitted. Power amplifiers often require the use of a linearization function adapted to their operating mode.

Class G radiofrequency power amplification, that is to say using a power supply voltage composed of multiple discrete levels, makes it possible to greatly improve the efficiency of the systems even for very large modulation bandwidths.

However, this technique must be coupled with a linearization technique in order to eliminate the significant distortions introduced by this type of amplification technique.

Predistortion methods are very widespread for power amplification applications for telecommunications. However, they are not usable for power amplification of the class G type.

Class G operating radiofrequency power amplifiers can have significant variations in the power gain and the phase shift of the amplifier between the different supply voltages.

The gain and phase variations of the power amplifier depend on the frequency, the supplied power as well as the power supply voltage. They then lead to significant distortions of the signal to be emitted.

These distortions take place in the bandwidth of the signal to be emitted and are then reflected by transmission errors, but also take place in the adjacent channels of the signal to be emitted and in this case are reflected by the scrambling of these communication channels.

The present invention aims to address the drawbacks of the prior art, by proposing a system for baseband linearization for a class G radiofrequency power amplifier, said linearization system comprising a digital filter with complex coefficients positioned at the output of the digital predistortion module, which makes it possible to eliminate the distortions induced by the class G operating mode of the radiofrequency power amplifier, these distortions in particular arising due to the gain and phase differences for each of the power supply voltages of the class G radiofrequency power amplifier, but also due to the time required to switch from one discrete supply voltage to another.

The present invention therefore relates to a system of baseband linearization for a class G radiofrequency (RF) power amplifier, said linearization system comprising:
  a first input able to receive an input baseband digital signal to be emitted comprising an in-phase component, I, and a quadrature component, Q;
  a first output able to output a linearized output baseband digital signal to the class G RF power amplifier;
  a second input able to receive a baseband digital signal coming from the output of the class G RF power amplifier; and a second output able to output a digital power supply voltage selection signal to a DC-DC converter connected to the class G RF power amplifier;

said linearization system further comprising:

a module for selecting the amplifier power supply voltage, the input of which is connected to the first input of the linearization system and the output of which is connected to the second output of the linearization system, said module for selecting the amplifier power supply voltage being configured to select a power supply voltage from among at least two DC power supply voltages of the DC-DC converter as a function of the amplitude of the received input signal to be emitted;

a digital predistortion module connected to the first input of the linearization system and configured to perform a digital predistortion of the I and Q components of the received input signal to be emitted; and a module for extracting predistortion coefficients, an input of which is connected to the second input of the linearization system and configured to extract predistortion coefficients used by the digital predistortion module;

characterized in that said linearization system further comprises:

a digital filter with complex coefficients, the input of which is connected to the output of the digital predistortion module and the output of which is connected to the first output of the linearization system; and a module for extracting filter coefficients, an input of which is connected to the second input of the linearization system and configured to extract filter coefficients used by the digital filter with complex coefficients.

The maximum number of direct current supply voltages is preferably equal to 16.

Thus, the digital filter with complex coefficients makes it possible to cancel the distortions generated in the band of the modulated signal and in the adjacent channels. It also makes it possible to cancel the spectral noise generated by the distortions during each change of supply level of the class G RF power amplifier. The cancellation of the spectral noise is done over the entire instantaneous bandwidth for generation of the RF signal. The invention makes it possible to achieve noise levels in adjacent channels identical to those obtained on a RF power amplifier typically operating in class AB.

The linearization system is made in baseband within a digital circuit on the in-phase and quadrature components (I and Q) of the modulated signal to be emitted. The modification of the signal to be emitted is done by cascading the digital predistortion module and the digital filter made in baseband, each of the digital predistortion module and the digital filter being coupled with a module for extracting coefficients dedicated to class G amplification.

Thus, the linearization system according to the invention associated with a class G RF power amplifier makes it possible to provide a constant power gain and phase shift at each operating instant.

The digital predistortion module used for the linearization is based on a baseband digital predistortion that is a nonlinear function corresponding to the inverse transfer function of the power amplifier to be linearized. The implementation of the digital predistortion module requires limited digital resources and makes it possible to achieve a very significant improvement in the linearity performance of the power amplifier.

When a class G RF power amplifier is coupled with a digital predistortion module, residual distortions appear at the output of the overall system at the time of each change in power supply level.

The switching speeds between the power supply levels being of the same order of magnitude as the throughputs symbolic of the modulations to be emitted in particular for large bandwidths, distortions appear at the output of the overall system at the time of each change in power supply level. During these transitions, the output of the digital predistortion module is then no longer appropriate for the power supply voltage actually applied to the power amplifier.

The distortions introduced by each power supply level change result in generating a spectral noise on either side of the bandwidth of the useful signal. These residual distortions are reflected by the introduction of unwanted spectral components into the adjacent communication channels. However, the spectral occupancy of this type of distortions is finite and directly related to the switching speed between the different power supply levels and the instantaneous bandwidth for generating the radiofrequency-modulated signal.

In the present invention, the suppression of the residual distortions at the output of the class G RF power amplifier coupled with the digital predistortion module is done using the specific digital filter operating in baseband. The use of such a filter is essential in order to account for the frequency characteristics of the power amplifier. A RF power amplifier indeed has gain and phase characteristics that depend on the power, the frequency and the power supply voltage. Furthermore, these characteristics are not identical on either side of a carrier frequency of a signal to be emitted. The cancellation of these distortions can only take place on a radiofrequency bandwidth equivalent to the instantaneous generating bandwidth of the emitter.

The frequency response of the digital filter with complex coefficients is preferably unsymmetrical between the positive and negative frequencies.

Thus, at the output of the digital predistortion module, the insertion into the processing chain of baseband in-phase and quadrature data (I and Q) of a specific digital filter serves to distort the spectrum of the linearization signal from the digital predistortion module in order to cancel the residual spectral distortions, the specific digital filter being a digital filter with complex coefficients, that is to say whose coefficients have both a real part and an imaginary part.

According to a first variant of the invention, the digital predistortion module is configured to carry out a one-dimensional digital predistortion as a function of the amplitude of the I and Q components of the signal to be emitted.

Thus, a one-dimensional linearization function depending only on the amplitude of the envelope of the signal to be emitted is satisfactory for a class G power amplifier due to the fact that the power supply voltage applied to the power amplifier is directly related to the amplitude of the envelope of the signal to be emitted.

In the case of a one-dimensional digital predistortion module, the predistortion factor to be applied is thus only dependent on the modulus of the baseband complex digital signal (I and Q).

According to a second variant of the invention, the digital predistortion module is configured to carry out a two-dimensional digital predistortion as a function of the amplitude of the I and Q components of the signal to be emitted and the power supply voltage selected by the module for selecting the amplifier power supply voltage.

Thus, in this case, it is considered that the parameters of the predistortion function must depend on both the amplitude of the envelope of the signal to be emitted and the power supply voltage applied to the power amplifier for signal processing issues.

In the case of a two-dimensional digital predistortion module, the predistortion factor to be applied depends on both the modulus of the baseband complex digital signal (I and Q) as well as on the power supply voltage that is selected and applied to the class G RF power amplifier.

According to one particular feature of the invention, the digital predistortion module is configured to perform a digital predistortion of the polynomial type without memory using at least one look-up table stored in a memory or a nonlinear equation, or to perform a digital predistortion of the memory polynomial type or of the Volterra series type.

Thus, the predistortion function can be carried out in a programmable digital circuit from a look-up table (LUT) or from a mathematical equation.

The in-phase I and quadrature Q data of the signal to be emitted are injected into a digital predistortion module based on a nonlinear mathematical equation or as input of a look-up table implementing a nonlinear mathematical equation.

In the case of an implementation of the one-dimensional digital predistortion module by a look-up table, the predistortion coefficients are stored in a memory and indexed as a function of the amplitude of the envelope of the signal to be emitted.

In the case of an implementation of the two-dimensional digital predistortion module by a look-up table, each memory zone corresponds to a power supply voltage of the power amplifier operating in class G.

The digital predistortion module can also be based on a baseband digital predistortion from nonlinear mathematical functions for example of the memory polynomial or Volterra series type.

According to one particular feature of the invention, the linearization system further comprises an alignment module arranged at the second input of the linearization system, said alignment module being configured to align, in amplitude and in phase, the baseband digital signal coming from the output of the class G RF power amplifier with the other baseband digital signals.

Thus, the signal coming from the output of the power amplifier is aligned from an amplitude, delay and phase perspective so as to correspond with the different baseband digital signals of the linearization system.

According to one particular feature of the invention, the module for extracting predistortion coefficients is configured to extract the predistortion coefficients as a function of the baseband digital signal coming from the output of the class G RF power amplifier, from one among the output of the digital filter with complex coefficients and the output of the digital predistortion module, and from the power supply voltage selected by the module for selecting the amplifier power supply voltage.

The extraction of the coefficients from the digital predistortion module is carried out from the measurement of the signal output from the RF power amplifier independently of the presence or absence of a complex digital filter. When a complex digital filter is present, the module for extracting predistortion coefficients preferably uses the signal coming from the digital predistortion module, but could alternatively use the signal coming from the complex digital filter. For each applied power supply voltage, predistortion parameters are extracted independently. The extracted parameters are refined during successive extractions.

According to one particular feature of the invention, the module for extracting predistortion coefficients comprises first and second time delay units, a data separation unit and a unit for extracting predistortion coefficients, the first time delay unit being configured to compensate the propagation and processing time of the signal coming from one among the digital filter with complex coefficients and the digital predistortion module, the second time delay unit being configured to compensate the propagation and processing time of the signal coming from the output of the module for selecting the amplifier power supply voltage, the data separation unit being configured to separate and store, in a memory, the data concerning the baseband digital signal coming from the output of the power amplifier and the delayed signal coming from one among the digital filter with complex coefficients and the digital predistortion module as a function of the delayed power supply voltage selection signal, and the predistortion coefficient extraction unit being configured to extract, for each power supply voltage, the associated predistortion coefficients from data stored in memory by the data separation unit.

The extraction method implemented by the module for extracting predistortion coefficients is identical for the extraction of one-dimensional or two-dimensional predistortion coefficients.

The digital signals coming from the output of the digital predistortion module or from the output of the complex digital filter and that measured at the output of the RF power amplifier are aligned beforehand in amplitude, in phase and the propagation times are compensated so as to extract the linearization coefficients to be applied to the power amplifier.

The data separation unit is configured to separate and store, in memory, the incoming data in the module for extracting predistortion coefficients according to the selected power supply voltage. In the case of a class G amplification, the number of possible power supply voltages being very low, this task is without complexity and requires few digital resources.

The unit for extracting predistortion coefficients is configured to extract, independently for each possible power supply voltage, the coefficients of the digital predistortion module. The extracted coefficients, for each discrete power supply voltage, are next loaded differently into the digital predistortion module depending on whether it involves a digital predistortion with one or two dimensions. For example, in the case of a digital predistortion module implemented using look-up tables, the coefficients are stored in a single memory zone if the digital predistortion module is one-dimensional or in as many memory zones as there are power supply voltages used if the digital predistortion module is two-dimensional.

The process of extracting predistortion coefficients is done at predetermined time intervals so as to refine the predistortion coefficients over time and thus to obtain increased linearity performance of the power amplifier operating in class G. The continuous extraction process of the predistortion coefficients also makes it possible to account for variations of the operating conditions of the power amplifier such as an antenna mismatch or temperature variations.

According to one particular feature of the invention, the module for extracting filter coefficients is configured to extract the filter coefficients as a function of the I and Q components of the signal to be emitted, the baseband digital signal coming from the output of the class G RF power amplifier, from the output of the digital filter with complex coefficients, and the output of the digital predistortion module.

The extraction of the filter coefficients is done from the measurement of the output signal of the power amplifier when the digital predistortion module is applied beforehand. The extraction of the filter coefficients is done directly.

However, the optimization of these filter coefficients is done iteratively, that is to say that the values of the filter coefficients are refined over the course of successive determinations.

According to one particular feature of the invention, the module for extracting filter coefficients comprises three time delay units, a gain calculating unit, a filter output expected signal calculating unit, two fast Fourier transform (FFT) units, a filter frequency response calculating unit and a filter coefficient extraction unit, the three time delay units respectively being configured to compensate the propagation and processing times of the I and Q components of the signal to be emitted, the output of the digital filter with complex coefficients and the output of the digital predistortion module, the gain calculating unit being configured to calculate the complex gain of the power amplifier from the delayed output of the digital filter with complex coefficients and the baseband digital signal coming from the output of the power amplifier, the filter output expected signal calculating unit being configured to calculate the signal to be generated by the digital filter from the calculated complex gain and the delayed I and Q components of the signal to be emitted, the two FFT units respectively being configured to calculate the Fourier transforms of the delayed output of the digital predistortion module and of the signal to be generated by the digital filter calculated by the filter output expected signal calculating unit, the filter frequency response calculating unit being configured to calculate the frequency response of the digital filter to be generated from two Fourier transforms calculated by the FFT units, and the filter coefficient extraction unit being configured to extract the complex coefficients of the digital filter to be synthesized as a function of the frequency response calculated by the filter frequency response calculating unit.

The various useful baseband digital signals that are present are aligned beforehand in amplitude, in phase and the propagation times are compensated if necessary so as to determine the transfer function of the digital filter to be synthesized and to be implemented at the output of the digital predistortion module.

The digital predistortion module must necessarily have been applied beforehand so as to perform the extraction of the coefficients of the complex digital filter.

Initially, upon starting the identification process, no filtering is applied at the output of the digital predistortion module. If no filtering is applied, the complex digital filter then takes a unity gain upon commencement of the identification process.

The gain calculating unit makes it possible to calculate the complex gain of the radiofrequency system at each sampling instant according to the equation:

$$\text{Gain}(n) = \frac{\text{Amplifier OUT}(n)}{\text{FLT OUT}(n)},$$

where n is the index of the sample, Amplifier OUT is the output signal of the RF power amplifier and FLT OUT is the output signal of the digital filter with complex coefficients.

In the filter output calculating unit, the new linearization signal to be generated is calculated for each sampling instant so as to cancel out the residual spectral distortions according to the equation:

$$\text{New FLT OUT}(n) = \frac{\text{Original Waveform}(n)}{\text{Gain}(n)},$$

where n is the index of the sample, Original Waveform is the original signal to be emitted and New FLT OUT is the new output of the digital filter with complex coefficients to be generated.

In the FFT units, the Fourier transforms of the new linearization signal to be generated previously calculated and of the signal coming from the digital predistortion module are calculated on a number of samples predefined according to the equations:

New FLT OUT$_{spectrum}(f)$=DFT[New FLT OUT($n$)],

DPD OUT$_{spectrum}(f)$=DFT[DPD OUT($n$)], where DFT refers to the discrete Fourier transform of a sampled signal, this function being implemented using a fast Fourier transform (FFT) algorithm, f designates the index of the sample after Fourier transform, DPD OUT is the output of the digital predistortion module, New FLT OUT$_{spectrum}$ is the Fourier transform of the new filter output to be generated and DPD OUT$_{spectrum}$ is the Fourier transform of the output of the digital predistortion module.

The frequency response H of the digital filter to be generated is next estimated in the frequency response calculating unit of the filter according to the equation:

$$H(f) = \frac{\text{New FLT OUT}_{spectrum}(f)}{\text{DPD OUT}_{spectrum}(f)},$$

where f is the index of the sample after Fourier transform, this index corresponding to a frequency index.

The filter coefficient extraction unit makes it possible to calculate the complex coefficients of the digital filter to be synthesized.

The procedure for identifying the complex digital filter according to the invention, making it possible to eliminate the residual distortions induced by a class G amplifier operation, is done upon each iteration of the extraction system.

As a result, the coefficients of the digital filter are updated during the iterations until reaching linearity performance levels in compliance with the norms of the signals to be emitted. This method makes it possible to refine the coefficients of the complex digital filter over time and thus to obtain increased linearity performance levels of the RF power amplifier operating in class G, but also to account for variations of the operating conditions of the power amplifier, such as an antenna mismatch or temperature variations.

The complex digital filter associated with its extraction process primarily makes it possible to eliminate the residual distortions induced by the class G operation of the power amplifier previously linearized by a digital predistortion module. It also makes it possible to finely temporally realign the generated radiofrequency signal at the input of the power amplifier with respect to the power supply command signal of the class G power amplifier. Indeed, if a small time shift exists between the power supply command signal and the signal generated at the output of the digital predistortion module, it is automatically corrected by the complex digital filter.

According to one particular feature of the invention, the digital filter with complex coefficients is made using several finite impulse response (FIR) filters.

The output y of the digital filter of the FIR type is expressed as follows as a function of the input signal x:

$$y(n) = \sum_{k=0}^{M-1} C(k) \times x(n-k)$$

where M is the number of coefficients of the digital filter and C(k) are the complex coefficients of the digital filter.

The direct implantation of such a filter in a programmable digital circuit is impossible because a FIR filter necessarily requires coefficients that are real numbers. The implantation of the digital filter in a digital circuit is done by implementing different architectures equivalent to a FIR filter with complex coefficients.

The coefficients of the digital filter are calculated by the module for extracting filter coefficients so as to minimize the quadratic error between the frequency response to be synthesized and the synthesized frequency response of the FIR filter with complex coefficients.

According to a first embodiment of the invention, the digital filter with complex coefficients comprises two identical first FIR filters whose coefficients correspond to the real part of the complex coefficients of the digital filter with complex coefficients, two second identical FIR filters whose coefficients correspond to the imaginary part of the complex coefficients of the digital filter with complex coefficients, an adder and a subtracter, one of the first FIR filters, receiving as input the I component of the output signal of the digital predistortion module, and one of the second FIR filters, receiving as input the Q component of the output signal of the digital predistortion module, being connected at the output to the subtracter so as to create the I component of the output signal of the digital filter with complex coefficients, the other of the first FIR filters, receiving as input the Q component of the output signal of the digital predistortion module, and the other of the second FIR filters, receiving as input the I component of the output signal of the digital predistortion module, being connected at the output to the adder so as to create the Q component of the output signal of the digital filter with complex coefficients.

Thus, this implementation of digital filter with complex coefficients consists in using four digital filters of the FIR type that are identical in pairs, of an adder and a subtracter.

According to a second embodiment of the invention, the digital filter with complex coefficients comprises a first FIR filter whose coefficients correspond to the sum of the real and imaginary parts of the coefficients of the digital filter with complex coefficients, a second FIR filter whose coefficients correspond to the imaginary part of the coefficients of the digital filter with complex coefficients, a third FIR filter whose coefficients correspond to the difference between the real part and the imaginary part of the coefficients of the digital filter with complex coefficients, two adders and one subtracter, the first FIR filter receiving as input the I component of the output signal of the digital predistortion module, the third FIR filter receiving as input the Q component of the output signal of the digital predistortion module, the second FIR filter receiving as input the sum of the I and Q components of the output signal of the digital predistortion module by means of one of the adders, the outputs of the first and second FIR filters being connected to the subtracter so as to create the I component of the output signal of the digital filter with complex coefficients, and the outputs of the second and third FIR filters being connected to the other of the adders so as to create the Q component of the output signal of the digital filter with complex coefficients.

Thus, this alternative embodiment consists in using three digital filters that are all different, two adders and one subtracter.

It is also possible to use other alternative structures using three FIR filters so as to produce a FIR filter with complex coefficients.

The present invention also relates to a system for the envelope tracking technique comprising a baseband linearization system as described above, a class G RF power amplifier, a DC-DC converter, an analog-to-digital converter, an up-conversion mixer and a down-conversion mixer, the DC-DC converter being arranged between the second output of the linearization system and the power supply input of the power amplifier, the digital-to-analog converter and the up-conversion mixer being arranged in series between the first output of the linearization system and the RF input of the power amplifier, the down-conversion mixer and the analog-to-digital converter being arranged in series between the output of the power amplifier and the second input of the linearization system.

Thus, the digital linearization signal is converted into an analog quantity using the digital-to-analog converter on the in-phase and quadrature channels.

The analog baseband signal is next transposed around the radiofrequency carrier frequency by the up-conversion mixer.

The generated signal is lastly injected at the input of the class G RF power amplifier according to different gain stages according to the topology of the amplification chain.

In order to extract the linearization parameters, that is to say the coefficients of the digital predistortion module and the digital filtering coefficients, part of the output signal of the power amplifier is retrieved and transposed into baseband by the down-conversion mixer, before being digitized using the analog-to-digital converter.

The DC-DC converter makes it possible to provide the power amplifier with one of the discrete power supply voltages as a function of the power supply voltage selection signal coming from the linearization system.

The present invention further relates to a method for extracting coefficients of the digital filter with complex coefficients from a linearization system as described above, said method comprising the following steps:
  acquiring input signals of the module for extracting filter coefficients during a sampled predefined time period;
  calculating, at each sampling instant, the complex gain of the power amplifier using the gain calculating unit;
  calculating, at each sampling instant, the signal to be generated by the digital filter using the filter output expected signal calculating unit;
  calculating, on a predefined number of samples, Fourier transforms of the output of the digital predistortion module and the signal to be generated by the digital filter;

calculating the transfer function of the digital filter to be synthesized using the filter frequency response calculating unit;

calculating the coefficients of the digital filter using the filter coefficient extraction unit; and updating the coefficients in the digital filter with complex coefficients;

the calculation and updating of the filter coefficients being done iteratively at predetermined time intervals, the filter coefficients being refined over the course of the successive iterations.

The module for extracting filter coefficients needs several iterations to extract the coefficients from the filter. This extraction process can, however, be done continuously in order to prevent any change in the operating conditions of the class G RF power amplifier.

To better illustrate the subject matter of the present invention, we will describe hereinafter, as an illustration and non-limitingly, two preferred embodiments, in reference to the appended drawings.

In these drawings:

FIG. 1 shows a block diagram of a system for the envelope tracking technique comprising a baseband linearization system according to a first variant of the invention;

FIG. 2 shows a block diagram of a system for the envelope tracking technique comprising a baseband linearization system according to a second variant of the invention;

FIG. 3 shows a block diagram of the digital predistortion module of the linearization system of FIG. 1;

FIG. 4 shows a block diagram of the digital predistortion module of the linearization system of FIG. 2;

FIG. 5 shows a schematic diagram of the digital predistortion module of the linearization system of FIG. 1;

FIG. 6 shows a schematic diagram of a digital predistortion module of the linearization system of FIG. 2;

FIG. 7 shows a block diagram of the module for extracting predistortion coefficients of the linearization system according to the present invention;

FIG. 8 shows a block diagram of the module for extracting filter coefficients of the linearization system according to the present invention;

FIG. 9 shows a block diagram of the digital filter with complex coefficients of the linearization system according to a first embodiment of the invention;

FIG. 10 shows a block diagram of the digital filter with complex coefficients of the linearization system according to a second embodiment of the invention;

FIG. 11 is a graph as an example showing the gain magnitude of the predistortion to be generated in order to linearize a class G RF power amplifier;

FIG. 12 is a graph as an example showing the gain magnitude of the digital filter with complex coefficients to be synthesized;

FIG. 13 is a graph as an example showing the phase of the gain of the digital filter with complex coefficients to be synthesized; and FIG. 14 is a graph as an example showing the output spectrums of the class G RF power amplifier with and without the linearization system of the present invention.

FIG. 1 shows a system for the envelope tracking technique 1 comprising a baseband linearization system 2 according to a first variant of the invention.

The system for the envelope tracking technique 1 comprises a baseband linearization system 2, a class G RF power amplifier 3 and a DC-DC converter 4.

The linearization system 2 comprises a first input 2a able to receive a baseband digital input signal to be emitted comprising an in-phase component, I, and a quadrature component, Q; a first output 2b able to output a linearized output baseband digital signal to the class G RF power amplifier 3; a second input 2c able to receive a baseband digital signal coming from the output 3a of the RF power amplifier 3; and a second output 2d able to output a power supply voltage selection digital signal to the DC-DC converter 4 connected to the power supply input 3b of the class G RF power amplifier 3.

The DC-DC converter 4 makes it possible to provide the class G RF power amplifier 3 with one of a plurality of discrete power supply voltages as a function of the power supply voltage selection signal coming from the second output 2d of the linearization system 2.

The output 3a of the RF power amplifier 3 is further connected to a transmitting antenna 5.

The system for the envelope tracking technique 1 further comprises a digital-to-analog converter 6 and an up-conversion mixer 7 arranged in series between the first output 2b of the linearization system 2 and the RF input 3c of the RF power amplifier 3.

Thus, the linearized output baseband digital signal coming from the first output 2b of the linearization system 2 is converted into an analog quantity by the digital-to-analog converter 6 on the I and Q channels, then transposed around the radiofrequency carrier frequency by the up-conversion mixer 7, the generated signal lastly being injected at the input 3c of the RF power amplifier 3.

The system for the envelope tracking technique 1 further comprises a down-conversion mixer 8 and an analog-to-digital converter 9 arranged in series between the output 3a of the RF power amplifier 3 and the second input 2c of the linearization system 2.

Thus, part of the output signal 3a of the RF power amplifier 3 is retrieved, then transposed into baseband by the down-conversion mixer 8, before being converted into a digital quantity using the analog-to-digital converter 9.

The system for the envelope tracking technique 1 further comprises a local oscillator 10 connected to the up-conversion mixer 7 and to the down-conversion mixer 8.

The linearization system 2 comprises a module for selecting the amplifier power supply voltage 11, the input of which is connected to the first input 2a of the linearization system 2 and the output of which is connected to the second output 2d of the linearization system 2, said module for selecting the amplifier power supply voltage 11 being configured to select a power supply voltage from among at least two DC power supply voltages as a function of the amplitude of the received input signal to be emitted at the first input 2a of the linearization system 2.

The maximum number of direct current supply voltages is preferably equal to 16.

The linearization system 2 further comprises a one-dimensional digital predistortion module 12 connected to the first input 2a of the linearization system 2 and configured to perform a digital predistortion of the I and Q components of the received input signal to be emitted received at the first input 2a of the linearization system 2.

The digital predistortion module 12 used for the linearization is based on a baseband digital predistortion that is a nonlinear function corresponding to the inverse transfer function of the power amplifier 3 to be linearized. The implementation of the digital predistortion module 12 requires limited digital resources and makes it possible to achieve a very significant improvement in the linearity performance of the power amplifier 3.

The linearization system 2 further comprises a digital filter with complex coefficients 13, the input of which is connected to the output of the digital predistortion module 12 and the output of which is connected to the first output 2b of the linearization system 2.

The digital filter with complex coefficients 13 makes it possible to cancel the distortions generated in the band of the modulated signal and in the adjacent channels. It also makes it possible to cancel the spectral noise generated by the distortions during each change of supply level of the class G RF power amplifier 3. The cancellation of the spectral noise is done over the entire instantaneous bandwidth for generation of the RF signal.

The frequency response of the digital filter with complex coefficients 13 is preferably unsymmetrical between the positive and negative frequencies.

Thus, at the output of the digital predistortion module 12, the insertion into the processing chain of baseband in-phase and quadrature data (I and Q) of the digital filter 13 serves to distort the spectrum of the linearization signal from the digital predistortion module 12 in order to cancel the residual spectral distortions, the digital filter 13 being a digital filter with complex coefficients, that is to say whose coefficients have both a real part and an imaginary part.

The linearization system 2 further comprises an alignment module 14 connected to the second input 2c of the linearization system 2, said alignment module 14 being configured to align, in amplitude and in phase, the baseband digital signal coming from the output 3a of the RF power amplifier 3 with the other baseband digital signals of the linearization system 2.

The linearization system 2 further comprises a module for extracting predistortion coefficients 15 configured to extract predistortion coefficients 15a used by the digital predistortion module 12.

The predistortion coefficients 15a are extracted by the module for extracting predistortion coefficients 15 as a function of the output of the alignment module 14 (that is to say the output 3a of the power amplifier 3), the output of the digital predistortion module 12 and the output of the module for selecting the amplifier power supply voltage 11 (that is to say the selected power supply voltage).

It should be noted that the predistortion coefficients 15a could also be extracted as a function of the output of the digital filter with complex coefficients 13 instead of the output of the digital predistortion module 12, without deviating from the scope of the present invention, a switch 17 having been shown in FIG. 1 in order to illustrate these two alternatives.

For each of the power supply voltages applied to the power amplifier 3, predistortion coefficients 15a are extracted independently, the extracted predistortion coefficients 15a being refined over the course of successive extractions.

The linearization system 2 further comprises a module for extracting filter coefficients 16 configured to extract filter coefficients 16a used by the digital filter with complex coefficients 13.

The filter coefficients 16a are extracted by the module for extracting filter coefficients 16 as a function of the I and Q components of the signal to be emitted coming from the first input 2a of the linearization system 2, the output of the alignment module 14 (that is to say the output 3a of the power amplifier 3), the output of the digital filter with complex coefficients 13 and the output of the digital predistortion module 12.

The extraction of the filter coefficients 16a is thus done from the measurement of the output signal of the power amplifier 3 when the digital predistortion module 12 is applied beforehand. The optimization of the filter coefficients 16a is done iteratively, that is to say that the values of the filter coefficients 16a are refined over the course of successive determinations.

FIG. 2 shows a system for the envelope tracking technique 1' comprising a baseband linearization system 2' according to a second variant of the invention.

The common elements between the first variant of the invention in FIG. 1 and this second variant of the invention bear the same reference numeral, and will not be described in more detail here when they have identical structures.

The system for the envelope tracking technique 1' according to the second variant is identical to the system for the envelope tracking technique 1 according to the first variant with the exception of the fact that, in the second variant, the digital predistortion module 12' of the linearization system 2' is configured to perform a two-dimensional digital predistortion. The two-dimensional digital predistortion module 12' comprises two inputs that are respectively connected to the first input 2a of the linearization system 2' and to the output of the module for selecting the amplifier power supply voltage 11.

The digital predistortion module 12' is thus configured to carry out a digital predistortion as a function of the amplitude of the I and Q components of the signal to be emitted and the power supply voltage selected by the module for selecting the amplifier power supply voltage 11.

FIG. 3 shows the digital predistortion module 12 of the linearization system 2 according to the first variant of the invention.

According to the first variant of the invention, the digital predistortion module 12 is configured to carry out a one-dimensional digital predistortion as a function of the amplitude of the I and Q components of the signal to be emitted.

In the case of the one-dimensional digital predistortion module 12, the predistortion factor to be applied is only dependent on the modulus of the baseband complex digital signal.

The one-dimensional digital predistortion module 12 comprises two inputs $I_{IN}$ and $Q_{IN}$, respectively receiving the I and Q components of the signal to be emitted, and two outputs $I_{OUT}$ and $Q_{OUT}$.

The one-dimensional digital predistortion module 12 comprises a modulus calculating unit 12a configured to calculate the modulus 12c of the signal to be emitted from data received on the inputs $I_{IN}$ and $Q_{IN}$.

The one-dimensional digital predistortion module 12 further comprises a one-dimensional (1D) digital predistortion unit 12b configured to perform a digital predistortion on the data received on the inputs $I_{IN}$ and $Q_{IN}$ as a function of the modulus 12c calculated by the modulus calculating unit 12a, the linearized I and Q components of the signal to be emitted being output on the outputs $I_{OUT}$ and $Q_{OUT}$.

FIG. 4 shows the digital predistortion module 12' of the linearization system 2' according to the second variant of the invention.

According to the second variant of the invention, the digital predistortion module 12' is configured to carry out a two-dimensional digital predistortion as a function of the amplitude of the I and Q components of the signal to be emitted and as a function of the power supply voltage applied to the class G RF power amplifier 3.

The two-dimensional digital predistortion module 12' comprises two inputs $I_{IN}$ and $Q_{IN}$, respectively receiving the I and Q components of the signal to be emitted, one additional input 12d', receiving the power supply voltage selection signal output by the module for selecting the amplifier power supply voltage 11, and two outputs $I_{OUT}$ and $Q_{OUT}$.

The two-dimensional digital predistortion module 12' comprises a modulus calculating unit 12a' configured to calculate the modulus 12c' of the signal to be emitted from data received on the inputs $I_{IN}$ and $Q_{IN}$.

The two-dimensional digital predistortion module 12' further comprises a two-dimensional (2D) digital predistortion unit 12b' configured to perform a digital predistortion on the data received on the inputs $I_{IN}$ and $Q_{IN}$ as a function of the modulus 12c' calculated by the modulus calculating unit 12a' and as a function of the power supply voltage selection signal received on the additional input 12d', the linearized I and Q components of the signal to be emitted being output on the outputs $I_{OUT}$ and $Q_{OUT}$.

FIG. 5 shows the 1D digital predistortion module 12 of the linearization system 2 according to the first variant of the invention.

The implementation of the 1D digital predistortion module 12 based on a look-up table is described in FIG. 5 in the case of a digital predistortion of the polynomial type without memory.

In the case of an embodiment of the 1D digital predistortion module 12 by a look-up table, the predistortion coefficients are stored in a memory 18 and indexed as a function of the signal modulus to be emitted calculated by the modulus calculating unit 12a, a complex multiplier 19 making it possible to apply the selected predistortion coefficients to the I and Q components of the signal to be emitted.

The 1D digital predistortion module 12 could also be based on a baseband digital predistortion from nonlinear mathematical functions for example of the memory polynomial or Volterra series type, without deviating from the scope of the present invention.

FIG. 6 shows the 2D digital predistortion module 12' of the linearization system 2' according to the second variant of the invention.

The implementation of the 2D digital predistortion module 12' based on look-up tables is described in FIG. 6 in the case of a digital predistortion of the polynomial type without memory for a G class power amplifier 3 able to assume three power supply voltage levels.

In the case of an implementation of the 2D digital predistortion module 12' by look-up tables, the predistortion coefficients are stored in several memories 18', each memory 18' corresponding to a power supply voltage of the G class power amplifier 3.

In each memory 18', the predistortion coefficients are indexed as a function of the signal modulus to be emitted calculated by the modulus calculating unit 12a', a complex multiplier 19' making it possible to apply the selected predistortion coefficients to the I and Q components of the signal to be emitted.

The 2D digital predistortion module 12' can also be based on a baseband digital predistortion from nonlinear mathematical functions for example of the memory polynomial or Volterra series type, without deviating from the scope of the present invention.

FIG. 7 shows the module for extracting predistortion coefficients 15 of the linearization system 2 according to the present invention.

The module for extracting predistortion coefficients 15 comprises an output 15a outputting the predistortion coefficients to the digital predistortion module 12, a first input 15b receiving one among the output of the digital predistortion module 12 and the output of the digital filter 13 as a function of the position of the switch 17, a second input 15C receiving the output of the alignment module 14 (corresponding to the output 3a of the power amplifier 3), and a third input 15d receiving the output of the module for selecting the amplifier power supply voltage 11.

The module for extracting predistortion coefficients 15 comprises first and second time delay units 20a, 20b, a data separation unit 21 and a unit for extracting predistortion coefficients 22.

The first time delay unit 20a is configured to compensate the propagation and processing time of the signal coming from one among the digital filter with complex coefficients 13 and the digital predistortion module 12.

The second time delay unit 20b is configured to compensate the propagation and processing time of the signal coming from the output of the module for selecting the amplifier power supply voltage 11.

The data separation unit 21 is configured to separate and store, in a memory, the data concerning the baseband digital signal coming from the output of the alignment module 14 (corresponding to the output 3a of the power amplifier 3) and the delayed signal coming from one among the digital filter with complex coefficients 13 and the digital predistortion module 12 as a function of the delayed power supply voltage selection signal output by the module for selecting the amplifier power supply voltage 11. In the case of class G amplification, the number of possible power supply voltages being very low, this task is without complexity and requires few digital resources.

The predistortion coefficient extraction unit 22 is configured to extract, for each possible power supply voltage of the power amplifier 3, the associated predistortion coefficients from data stored in memory by the data separation unit 21. The extracted predistortion coefficients, for each discrete power supply voltage, are next loaded differently into the digital predistortion module 12, 12' depending on whether it involves a digital predistortion with one or two dimensions. For example, in the case of the digital predistortion module 12, 12' implemented using look-up tables, the predistortion coefficients are stored in a single memory zone 18 if the digital predistortion module 12 is one-dimensional or in as many memory zones 18' as there are power supply voltages used if the digital predistortion module 12' is two-dimensional.

The process of extracting predistortion coefficients is done at predetermined time intervals so as to refine the predistortion coefficients over time and thus to obtain increased linearity performance of the class G power amplifier 3. The continuous extraction process of the predistortion coefficients also makes it possible to account for variations of the operating conditions of the power amplifier 3 such as an antenna mismatch or temperature variations.

FIG. 8 shows the module for extracting filter coefficients 16 of the linearization system 2 according to the present invention.

The module for extracting filter coefficients 16 comprises an output 16a outputting the filter coefficients to the digital filter with complex coefficients 13, a first input 16b receiving the I and Q components of the input signal to be emitted, a second input 16c receiving the output of the predistortion module 12, a third input 16d receiving the output of the digital filter with complex coefficients 13 and a fourth input 16e receiving the output of the alignment module 14 (corresponding to the output 3a of the power amplifier 3).

The module for extracting filter coefficients 16 comprises three time delay units 23a, 23b, 23c, a gain calculating unit 24, a filter output expected signal calculating unit 25, two fast Fourier transform (FFT) units 26a, 26b, a filter frequency response calculating unit 27 and a filter coefficient extraction unit 28.

The three time delay units 23a, 23b, 23c are respectively configured to compensate the propagation and processing times of the I and Q components of the signal to be emitted, the output of the digital predistortion module 12 and the output of the digital filter with complex coefficients 13.

The gain calculating unit 24 is configured to calculate the complex gain of the power amplifier 3 from the delayed output of the digital filter with complex coefficients 13 and the baseband digital signal coming from the output of the alignment module 14 (corresponding to the output 3a of the power amplifier 3).

The filter output expected signal calculating unit 25 is configured to calculate the signal to be generated by the digital filter 13 from the complex gain calculated by the gain calculating unit 24 and the delayed I and Q components of the signal to be emitted.

The two FFT units 26a, 26b are respectively configured to calculate the fast Fourier transforms of the delayed output of the digital predistortion module 12 and the signal to be generated by the digital filter 13 calculated by the filter output expected signal calculating unit 25.

The filter frequency response calculating unit 27 is configured to calculate the frequency response of the digital filter 13 to be generated from two fast Fourier transforms calculated by the two FFT units 26a, 26b.

The filter coefficient extraction unit 28 is configured to extract the complex coefficients of the digital filter 13 to be synthesized as a function of the frequency response calculated by the filter frequency response calculating unit 27.

It should be noted that the digital predistortion module 12 must necessarily have been previously applied before conducting the extraction of the coefficients of the complex digital filter 13.

Initially, upon starting the identification process, no filtering is applied at the output of the digital predistortion module 12. If no filtering is applied, the complex digital filter 13 then takes a unit gain upon commencement of the identification process.

The gain calculating unit 24 makes it possible to calculate the complex gain of the power amplifier 3 at each sampling instant according to the equation:

$$\text{Gain}(n) = \frac{\text{Amplifier OUT}(n)}{\text{FLT OUT}(n)},$$

where n is the index of the sample, Amplifier OUT is the output signal of the power amplifier 3 and FLT OUT is the output signal of the digital filter with complex coefficients 13.

In the filter output calculating unit 25, the new linearization signal to be generated is calculated for each sampling instant so as to cancel out the residual spectral distortions according to the equation:

$$\text{New } FLT \text{ OUT}(n) = \frac{\text{Original Waveform}(n)}{\text{Gain}(n)}$$

where n is the index of the sample, Original Waveform is the original signal to be emitted and New FLT OUT is the new output of the digital filter with complex coefficients 13 to be generated.

In the FFT units 26a, 26b, the Fourier transforms of the new linearization signal to be generated previously calculated and the signal coming from the digital predistortion module 12 are calculated on a number of samples predefined according to the equations:

New FLT OUT$_{spectrum}(f)$=DFT[New FLT OUT$(n)$],

DPD OUT$_{spectrum}(f)$=DFT[DPD OUT$(n)$], where DFT designates the discrete Fourier transform function of a sampled signal, this function being implemented using a fast Fourier transform (FFT) algorithm, f designates the index of the sample after Fourier transform, DPD OUT is the output of the digital predistortion module 12, New FLT OUT$_{spectrum}$ is the Fourier transform of the new filter output 13 to be generated and DPD OUT$_{spectrum}$ is the Fourier transform of the output of the digital predistortion module 12.

The frequency response H of the digital filter 13 to be generated is next estimated in the frequency response calculating unit of the filter 27 according to the equation:

$$H(f) = \frac{\text{New } FLT \text{ OUT}_{spectrum}(f)}{DPD \text{ OUT}_{spectrum}(f)},$$

where f is the index of the sample after Fourier transform, this index corresponding to a frequency index.

Lastly, the filter coefficient extraction unit 28 makes it possible to calculate the complex coefficients of the digital filter 13 to be synthesized.

The calculation of the filter coefficients is done iteratively at predetermined time intervals, the filter coefficients being refined over the course of the successive iterations. The module for extracting filter coefficients 16 indeed needs several iterations to extract the coefficients from the filter.

The coefficients of the digital filter 13 are updated during the iterations until reaching linearity performance levels in compliance with the norms of the signals to be emitted. This method makes it possible to refine the coefficients of the complex digital filter 13 over time and thus to obtain increased linearity performance levels of the class G RF power amplifier 3, but also to account for variations of the operating conditions of the power amplifier 3, such as an antenna mismatch or temperature variations.

FIG. 9 shows the digital filter with complex coefficients 13 of the linearization system 2 according to a first variant of the invention.

The output y of the digital filter with complex coefficients 13 is expressed as follows as a function of the input signal x:

$$y(n) = \sum_{k=0}^{M-1} C(k) \times x(n-k)$$

where M is the number of coefficients of the digital filter 13 and C(k) are the complex coefficients of the digital filter 13.

The direct implantation of such a filter 13 in a programmable digital circuit is impossible because a FIR filter necessarily requires coefficients that are real numbers. The implantation of the digital filter 13 in a digital circuit is done by implementing different architectures equivalent to a FIR filter with complex coefficients.

According to the first embodiment, the digital filter with complex coefficients 13 comprises two identical first finite impulse response (FIR) A filters 29a, 29b, the coefficients of which correspond to the real part of the complex coefficients of the digital filter with complex coefficients 13, two identical second FIR filters B 30a, 30b, the coefficients of which correspond to the imaginary part of the complex coefficients of the digital filter with complex coefficients 13, a subtracter 31 and an adder 32.

The digital filter with complex coefficients 13 comprises two inputs $I_{IN}$ and $Q_{IN}$, respectively receiving the I and Q components of the signal coming from the output of the digital predistortion module 12, and two outputs $I_{OUT}$ and $Q_{OUT}$, respectively outputting the I and Q components after filtering.

The first FIR filter A 29a receives, as input, the I component of the output signal of the digital predistortion module 12.

The second FIR filter B 30a receives, as input, the Q component of the output signal of the digital predistortion module 12.

The first FIR filter A 29a and the second FIR filter B 30a are connected at their output to the subtracter 31 so as to create the I component of the output signal $I_{OUT}$ of the digital filter with complex coefficients 13.

The first FIR filter A 29b receives, as input, the Q component of the output signal of the digital predistortion module 12.

The second FIR filter B 30b receives, as input, the I component of the output signal of the digital predistortion module 12.

The first FIR filter A 29b and the second FIR filter B 30b are connected at their output to the adder 32 so as to create the Q component of the output signal $Q_{OUT}$ of the digital filter with complex coefficients 13.

Thus, the first FIR filters A 29a, 29b receive, as coefficients, the real part of the coefficients C(k) of the synthesized complex digital filter 13, denoted $C_I(k)$, and the second FIR filters B receive, as coefficients, the imaginary part of the coefficients C(k) of the synthesized complex digital filter 13 denoted $C_Q(k)$.

$$C(k)=C_I(k)+j\times C_Q(k),$$

where j is the complex operator.

The in-phase output signal, denoted $I_{OUT}$, of the digital filter 13 is expressed as follows as a function of the in-phase $I_{IN}$ and quadrature $Q_{IN}$ input data:

$$I_{OUT}(n)=\Sigma_{k=0}^{M-1}C_I(k)\times I_{IN}(n-k)-\Sigma_{k=0}^{M-1}C_Q(k)\times Q_{IN}(n-k).$$

The quadrature output signal, denoted $Q_{OUT}$, of the digital filter 13 is expressed as follows as a function of the in-phase $I_{IN}$ and quadrature $Q_{IN}$ input data:

$$Q_{OUT}(n)=\Sigma_{k=0}^{M-1}C_I(k)\times Q_{IN}(n-k)+\Sigma_{k=0}^{M-1}C_Q(k)\times I_{IN}(n-k).$$

In each case, M is the number of coefficients of the digital filter 13, $C_I(k)$ and $C_Q(k)$ being the respective coefficients of the first FIR filters A and the second FIR filters B.

FIG. 10 shows the digital filter with complex coefficients 13 of the linearization system 2 according to a second embodiment of the invention.

According to the second embodiment, the digital filter with complex coefficients 13 comprises a first FIR filter A 33, the coefficients of which correspond to the sum of the real and imaginary parts of the coefficients of the digital filter with complex coefficients 13, a second FIR filter B 34, the coefficients of which correspond to the imaginary part of the coefficients of the digital filter with complex coefficients 13, a third FIR filter C 35, the coefficients of which correspond to the difference between the real part and the imaginary part of the coefficients of the digital filter with complex coefficients 13, two adders 36, 38 and a subtracter 37.

Thus, the first FIR filter A 33 receives, as coefficients, denoted $C_{Filter\_A}(k)$, the sum of the real and imaginary parts of the coefficients C(k) of the digital filter 13:

$$C_{Filter\_A}(k)=C_I(k)+C_Q(k).$$

The second FIR filter B 34 receives, as coefficients, denoted $C_{Filter\_B}(k)$, the imaginary part of the coefficients C(k) of the digital filter 13:

$$C_{Filter\_B}(k)=C_Q(k).$$

The third FIR filter C 35 receives, as coefficients, denoted $C_{Filter\_C}(k)$, the difference between the real and imaginary parts of the coefficients C(k) of the digital filter 13:

$$C_{Filter\_C}(k)=C_I(k)-C_Q(k).$$

The digital filter with complex coefficients 13 comprises two inputs $I_{IN}$ and $Q_{IN}$, respectively receiving the I and Q components of the signal coming from the output of the digital predistortion module 12, and two outputs $I_{OUT}$ and $Q_{OUT}$, respectively delivering the I and Q components after filtering.

The first FIR filter A 33 receives, as input, the I component of the output signal of the digital predistortion module 12.

The third FIR filter C 35 receives, as input, the Q component of the output signal of the digital predistortion module 12.

The second FIR filter B 34 receives, as input, the sum of the I and Q components of the output signal of the digital predistortion module 12 by means of the adder 36.

The outputs of the first FIR filter A 33 and the second FIR filter B 34 are connected to the subtracter 37 so as to create the I component of the output signal $I_{OUT}$ of the digital filter with complex coefficients 13.

The outputs of the second FIR filter B 34 and the third FIR filter C 35 are connected to the adder 38 so as to create the Q component of the output signal $Q_{OUT}$ of the digital filter with complex coefficients 13.

It should be noted that other alternative structures using at least three FIR filters could also be used to produce the digital filter with complex coefficients 13, without departing from the scope of the present invention.

FIGS. 11 to 14 show the measurement results as an example of one implementation of the linearization system 2 according the present invention.

The class G RF power amplifier 3 can have significant variations in the power gain and the phase shift of the amplifier 3 between the different discrete supply voltages supplied by the DC-DC converter 4. These gain and phase variations then lead to significant distortions of the signal to be emitted.

The response of the class G RF power amplifier 3 has different gain and phase characteristics between each of the discrete power supply voltages.

The digital predistortion module 12 serves to correct the gain and the phase specific to each discrete power supply voltage with respect to target gain and phase values that are identical for all of the discrete power supply voltages.

FIG. 11 shows a graph as an example showing the modulus of the gain of the predistortion DPD Gain (in dB), to be generated in order to linearize the class G RF power amplifier 3, as a function of the input power Pin (in dBm).

FIG. 11 illustrates, in the case of the one-dimensional digital predistortion module 12, the process carried out by the module for extracting predistortion coefficients 15.

For each of the four discrete power supply voltages that can be supplied by the DC-DC converter 4, the cloud of black dots shows the data measured at the input of the data separation unit 21 of the module for extracting predistortion coefficients 15, and the curve of white dots shows the response of the digital predistortion module 12 using the predistortion coefficients that were extracted separately for each discrete supply voltage.

The response of the class G RF power amplifier 3 coupled with the one-dimensional digital predistortion module 12 is next measured in order to perform the extraction of the coefficients of the digital filter with complex coefficients 13 via the module for extracting filter coefficients 16.

The modulated signal to be emitted has, in the scenario shown in FIGS. 11 to 14, a bandwidth of 1.3 MHz, the generating and acquisition bandwidth extending over a frequency range of 40 MHz.

The frequency response of the digital filter with complex coefficients 13 to be extracted is next determined by the frequency response calculating unit 27 within the module for extracting filter coefficients 16.

FIGS. 12 and 13 show graphs by way of examples respectively showing the modulus/magnitude of the gain (dB) of the digital filter with complex coefficients 13 to be synthesized and the phase (in degrees) of the gain of the digital filter with complex coefficients 13 to be synthesized, as a function of the frequency (in MHz).

In FIGS. 12 and 13, the curves in dotted lines show the data from the frequency response calculating unit 27.

FIGS. 12 and 13 illustrate the transfer function in magnitude and in phase of the filter with complex coefficients 13 to be synthesized in order to linearize the class G RF power amplifier 3.

The coefficients of the filter 13 are extracted by the filter coefficient extraction unit 28 and implanted in the digital filter with complex coefficients 13.

The curves in solid lines of FIGS. 12 and 13 show the frequency response of the digital filter with complex coefficients 13 synthesized by using, in the context of this example, sixty-four complex coefficients.

Implementing the linearization method makes it possible to extract the parameters of the digital predistortion module 12 and of the digital filter with complex coefficients 13. The baseband linearization system 2 according to the invention for a RF power amplifier 3 operating in class G thus makes it possible to eliminate the distortions caused by this operating mode of the amplifier 3.

FIG. 14 shows a graph as an example showing the output spectrums (Power in dBm) of the class G RF power amplifier 3 with and without the linearization system 2 of the present invention, as a function of the frequency (in MHz).

The curve in bold solid lines shows the measured spectrum of the signal to be emitted.

The curve in dotted lines shows the output spectrum of the class G RF power amplifier 3 alone, that is to say without the linearization system 2 of the invention.

The curve in non-bold solid lines shows the output spectrum of the class G RF power amplifier 3, coupled with the linearization system 2 according to the invention.

One can therefore see that the linearization system 2 according to the invention has made it possible to linearize the class G RF power amplifier 3 by eliminating the distortions caused by the class G operating mode of the amplifier 3.

The invention claimed is:

1. A system of baseband linearization for a class G radiofrequency (RF) power amplifier, the linearization system comprising:
    a first input configured to receive an input digital baseband signal to be emitted comprising an in-phase component, I, and a quadrature component, Q;
    a first output configured to output a linearized output baseband digital signal to the class G RF power amplifier;
    a second input configured to receive a baseband digital signal coming from the output of the class G RF power amplifier; and
    a second output configured to output a digital power supply voltage selection signal to a DC-DC converter connected to the class G RF power amplifier;
    the linearization system further comprising:
    a module for selecting an amplifier power supply voltage, the input of the module for selecting the amplifier power supply voltage being connected to the first input of the linearization system and the output of the module for selecting the amplifier power supply voltage being connected to the second output of the linearization system, the module for selecting the amplifier power supply voltage being configured to select a power supply voltage from among at least two DC power supply voltages of the DC-DC converter as a function of the amplitude of the received input digital baseband signal to be emitted;
    a digital predistortion module connected to the first input of the linearization system and configured to perform a digital predistortion of the I and Q components of the received input digital baseband signal to be emitted; and
    a module for extracting predistortion coefficients, an input of the module for extracting predistortion coefficients being connected to the second input of the linearization system and configured to extract predistortion coefficients used by the digital predistortion module;
    wherein the linearization system further comprises:
    a digital filter with complex coefficients, the input of the digital filter with complex coefficients being connected to the output of the digital predistortion module and the output of the digital filter with complex coefficients being connected to the first output of the linearization system; and
    a module for extracting filter coefficients, an input of the module for extracting filter coefficients being connected to the second input of the linearization system and configured to extract filter coefficients used by the digital filter with complex coefficients;
    the module for extracting filter coefficients being configured to extract the filter coefficients as a function of the I and Q components of the received input digital baseband signal to be emitted, of the baseband digital signal coming from the output of the class G RF power amplifier, of the output of the digital filter with complex coefficients, and of the output of the digital predistortion module;

the module for extracting filter coefficients comprising three time delay units, a gain calculating unit, a filter output expected signal calculating unit, two fast Fourier transform (FFT) units, a filter frequency response calculating unit and a filter coefficient extraction unit, the three time delay units respectively being configured to compensate propagation and processing times of the I and Q components of the received input digital baseband signal to be emitted, the output of the digital filter with complex coefficients and the output of the digital predistortion module, the gain calculating unit being configured to calculate the complex gain of the class G RF power amplifier from the delayed output of the digital filter with complex coefficients and the baseband digital signal coming from the output of the class G RF power amplifier, the filter output expected signal calculating unit being configured to calculate a signal to be generated by the digital filter with complex coefficients from the calculated complex gain and the delayed I and Q components of the received input digital baseband signal to be emitted, the two FFT units respectively being configured to calculate the Fourier transforms of the delayed output of the digital predistortion module and the signal to be generated by the digital filter with complex coefficients calculated by the filter output expected signal calculating unit, the filter frequency response calculating unit being configured to calculate the frequency response of the digital filter with complex coefficients to be generated from the Fourier transforms calculated by the FFT units, and the filter coefficient extraction unit being configured to extract the complex coefficients of the digital filter with complex coefficients to be synthesized as a function of the frequency response calculated by the filter frequency response calculating unit.

2. The linearization system according to claim 1, wherein the digital predistortion module is configured to carry out a one-dimensional digital predistortion as a function of the amplitude of the I and Q components of the received input digital baseband signal to be emitted.

3. The linearization system according to claim 1, wherein the digital predistortion module is configured to carry out a two-dimensional digital predistortion as a function of the amplitude of the I and Q components of the received input digital baseband signal to be emitted and of the power supply voltage selected by the module for selecting the amplifier power supply voltage.

4. The linearization system according to claim 1, wherein the digital predistortion module is configured to perform one of a digital predistortion of a polynomial without memory type using one of at least one look-up table stored in a memory and of a nonlinear equation, and of a digital predistortion of a polynomial with memory type or of a Volterra series type.

5. The linearization system according to claim 1, wherein the linearization system further comprises an alignment module arranged at the second input of the linearization system, the alignment module being configured to align in amplitude and in phase the baseband digital signal coming from the output of the class G RF power amplifier with the other baseband digital signals.

6. The linearization system according to claim 1, wherein the module for extracting predistortion coefficients is configured to extract the predistortion coefficients as a function of the baseband digital signal coming from the output of the class G RF power amplifier, from one among the output of the digital filter with complex coefficients and the output of the digital predistortion module, and from the power supply voltage selected by the module for selecting the amplifier power supply voltage.

7. The linearization system according to claim 6, wherein the module for extracting predistortion coefficients comprises first and second time delay units, a data separation unit and a unit for extracting predistortion coefficients, the first time delay unit being configured to compensate a propagation and processing time of a signal coming from one among the digital filter with complex coefficients and the digital predistortion module, the second time delay unit being configured to compensate the propagation and processing time of the signal coming from the output of the module for selecting the amplifier power supply voltage, the data separation unit being configured to separate and store in a memory a data concerning the baseband digital signal coming from the output of the class G RF power amplifier and the signal coming from one among the digital filter with complex coefficients and the digital predistortion module as a function of a delayed power supply voltage selection signal, and the predistortion coefficient extraction unit being configured to extract, for each power supply voltage, associated predistortion coefficients from data stored in memory by the data separation unit.

8. The linearization system according to claim 1, wherein the digital filter with complex coefficients is made using several finite impulse response (FIR) filters.

9. The linearization system according to claim 8, wherein the digital filter with complex coefficients comprises two identical first FIR filters, the coefficients of the first FIR filters corresponding to the real part of the complex coefficients of the digital filter with complex coefficients, two identical second FIR filters, the coefficients of the second FIR filters corresponding to an imaginary part of the complex coefficients of the digital filter with complex coefficients, an adder and a subtracter, one of the first FIR filters, receiving as input the I component of the output signal of the digital predistortion module, and one of the second FIR filters, receiving as input the Q component of the output signal of the digital predistortion module, being connected at the output to the subtracter so as to create the I component of the output signal of the digital filter with complex coefficients, the other of the first FIR filters, receiving as input the Q component of the output signal of the digital predistortion module, and the other of the second FIR filters, receiving as input the I component of the output signal of the digital predistortion module, being connected at the output to the adder so as to create the Q component of the output signal of the digital filter with complex coefficients.

10. The linearization system according to claim 8, wherein the digital filter with complex coefficients comprises a first FIR filter, the coefficients of the first FIR filter corresponding to the sum of the real and imaginary parts of the coefficients of the digital filter with complex coefficients, a second FIR filter, the coefficients of the second FIR filter corresponding to the imaginary part of the coefficients of the digital filter with complex coefficients, a third FIR filter, the coefficients of the third FIR filter corresponding to the difference between the real part and the imaginary part of the coefficients of the digital filter with complex coefficients, two adders and a subtracter, the first FIR filter receiving, as input, the I component of the output signal of the digital predistortion module, the third FIR filter receiving, as input, the Q component of the output signal of the digital predistortion module, the second FIR filter receiving, as input, the sum of the I and Q components of the output signal of the digital predistortion module by means of one of the adders, the outputs of the first and second FIR filters being connected to the subtracter so as to create the I component of the output signal of the digital filter with complex coefficients, and the outputs of the second and third FIR filters being connected to the other of the adders so as to create the Q component of the output signal of the digital filter with complex coefficients.

11. A system for the envelope tracking technique comprising a baseband linearization system according to claim 1, a class G RF power amplifier, a DC-DC converter, an analog-to-digital converter, a digital-to-analog converter, an up-conversion mixer and a down-conversion mixer, the DC-DC converter being arranged between the second output of the linearization system and the power supply input of the class G RF power amplifier, the digital-to-analog converter and the up-conversion mixer being arranged in series between the first output of the linearization system and the RF input of the class G RF power amplifier, the down-conversion mixer and the analog-to-digital converter being arranged in series between the output of the class G RF power amplifier and the second input of the linearization system.

12. A method for extracting coefficients of the digital filter with complex coefficients from a linearization system according to claim 1, the method comprising the following steps:

acquiring input signals of the module for extracting filter coefficients during a sampled predefined time period;

calculating, at each sampling instant, the complex gain of the class G RF power amplifier using the gain calculating unit;

calculating, at each sampling instant, the signal to be generated by the digital filter with complex coefficients using the filter output expected signal calculating unit;

calculating, on a predefined number of samples, Fourier transforms of the output of the digital predistortion module and of the signal to be generated by the digital filter with complex coefficients;

calculating the transfer function of the digital filter with complex coefficients to be synthesized using the filter frequency response calculating unit;

calculating the coefficients of the digital filter with complex coefficients using the filter coefficient extraction unit; and updating the coefficients in the digital filter with complex coefficients;

the calculation and updating of the filter coefficients being done iteratively at predetermined time intervals, the filter coefficients being refined over the course of the successive iterations.

13. The linearization system according to claim 2, wherein the digital predistortion module is configured to perform one of a digital predistortion of a polynomial without memory type using one of at least one look-up table stored in a memory and of a nonlinear equation, and of a digital predistortion of a polynomial with memory type or of a Volterra series type.

14. The linearization system according to claim 3, wherein the digital predistortion module is configured to perform one of a digital predistortion of a polynomial without memory type using one of at least one look-up table stored in a memory and of a nonlinear equation, and of a digital predistortion of a polynomial with memory type or of a Volterra series type.

15. The linearization system according to claim 2, wherein the linearization system further comprises an alignment module arranged at the second input of the linearization system, the alignment module being configured to align in amplitude and in phase the baseband digital signal coming from the output of the class G RF power amplifier with the other baseband digital signals.

16. The linearization system according to claim 3, wherein the linearization system further comprises an alignment module arranged at the second input of the linearization system, the alignment module being configured to align in amplitude and in phase the baseband digital signal coming from the output of the class G RF power amplifier with the other baseband digital signals.

17. The linearization system according to claim 4, wherein the linearization system further comprises an alignment module arranged at the second input of the linearization system, the alignment module being configured to align in amplitude and in phase the baseband digital signal coming from the output of the class G RF power amplifier with the other baseband digital signals.

18. The linearization system according to claim 2, wherein the module for extracting predistortion coefficients is configured to extract the predistortion coefficients as a function of the baseband digital signal coming from the output of the class G RF power amplifier, from one among the output of the digital filter with complex coefficients and the output of the digital predistortion module, and from the power supply voltage selected by the module for selecting the amplifier power supply voltage.

19. The linearization system according to claim 3, wherein the module for extracting predistortion coefficients is configured to extract the predistortion coefficients as a function of the baseband digital signal coming from the output of the class G RF power amplifier, from one among the output of the digital filter with complex coefficients and the output of the digital predistortion module, and from the power supply voltage selected by the module for selecting the amplifier power supply voltage.

20. The linearization system according to claim 4, wherein the module for extracting predistortion coefficients is configured to extract the predistortion coefficients as a function of the baseband digital signal coming from the output of the class G RF power amplifier, from one among the output of the digital filter with complex coefficients and the output of the digital predistortion module, and from the power supply voltage selected by the module for selecting the amplifier power supply voltage.

* * * * *